(12) United States Patent
Cai et al.

(10) Patent No.: US 10,686,058 B2
(45) Date of Patent: Jun. 16, 2020

(54) METHOD FOR MANUFACTURING TRENCH MOSFET

(71) Applicant: Silergy Semiconductor Technology (Hangzhou) LTD, Hangzhou, ZheJiang Province (CN)

(72) Inventors: Jinyong Cai, Zhejiang Province (CN); Zhongping Liao, Zhejiang Province (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/149,255

(22) Filed: Oct. 2, 2018

(65) Prior Publication Data

US 2019/0109216 A1    Apr. 11, 2019

(30) Foreign Application Priority Data

Oct. 11, 2017  (CN) .......................... 2017 1 0942472

(51) Int. Cl.
  *H01L 29/66*    (2006.01)
  *H01L 29/423*   (2006.01)
  (Continued)

(52) U.S. Cl.
  CPC .... *H01L 29/66734* (2013.01); *H01L 21/0332* (2013.01); *H01L 21/0337* (2013.01); *H01L 21/28035* (2013.01); *H01L 21/28525* (2013.01); *H01L 21/31144* (2013.01); *H01L 21/32055* (2013.01); *H01L 21/32135* (2013.01); *H01L 29/0865* (2013.01); *H01L 29/407* (2013.01);
  (Continued)

(58) Field of Classification Search
  None
  See application file for complete search history.

(56) References Cited

U.S. PATENT DOCUMENTS 5,420,451 A * 5/1995 Williams ............ H01L 29/1087
                                                            257/392
5,578,841 A * 11/1996 Vasquez .................. H01L 23/13
                                                            257/220
(Continued)

FOREIGN PATENT DOCUMENTS

CN            101740395 A       6/2010

*Primary Examiner* — Anthony Ho
*Assistant Examiner* — Kevin Quinto
(74) *Attorney, Agent, or Firm* — Michael C. Stephens, Jr.

(57) ABSTRACT

A method of manufacturing a trench MOSFET can include: forming an epitaxial semiconductor layer having a first doping type on a semiconductor substrate; forming a trench extending from a first surface of the epitaxial semiconductor layer to an internal portion of the epitaxial semiconductor layer; forming a first insulating layer and a shield conductor occupying a lower portion of said trench, where the first insulating layer is located on a lower sidewall surface and a bottom surface of the trench and separates the shield conductor from the epitaxial semiconductor layer; forming a second insulating layer covering a top surface of said shield conductor, where the second insulating layer is patterned by using a hard mask; forming a gate dielectric layer and a gate conductor occupying an upper portion of the trench; and forming a body region, a source region, and a drain electrode.

17 Claims, 12 Drawing Sheets

(51) Int. Cl.
*H01L 29/08* (2006.01)
*H01L 21/033* (2006.01)
*H01L 21/311* (2006.01)
*H01L 21/3205* (2006.01)
*H01L 21/285* (2006.01)
*H01L 21/28* (2006.01)
*H01L 29/417* (2006.01)
*H01L 21/3213* (2006.01)
*H01L 29/40* (2006.01)
*H01L 29/78* (2006.01)
*H01L 21/321* (2006.01)
*H01L 29/10* (2006.01)
*H01L 29/49* (2006.01)
*H01L 21/02* (2006.01)

(52) U.S. Cl.
CPC .... H01L 29/41741 (2013.01); H01L 29/4236 (2013.01); H01L 29/7813 (2013.01); *H01L 21/0223* (2013.01); *H01L 21/02255* (2013.01); *H01L 21/02271* (2013.01); *H01L 21/02274* (2013.01); *H01L 21/3212* (2013.01); *H01L 29/1095* (2013.01); *H01L 29/41766* (2013.01); *H01L 29/4916* (2013.01)

(56) References Cited

U.S. PATENT DOCUMENTS

| | | | |
|---|---|---|---|
| 6,008,096 A * | 12/1999 | Gardner | H01L 21/2256 438/300 |
| 6,162,654 A * | 12/2000 | Kawabe | G02F 1/133512 438/30 |
| 9,018,062 B2 | 4/2015 | Liao | |
| 9,245,977 B2 | 1/2016 | Liao | |
| 9,299,830 B1 | 3/2016 | Kawahara et al. | |
| 2001/0012655 A1* | 8/2001 | Nordstom | H01L 21/02164 438/239 |
| 2003/0148559 A1 | 8/2003 | Onishi et al. | |
| 2006/0289929 A1* | 12/2006 | Andrews | H01L 29/66734 257/330 |
| 2007/0075363 A1 | 4/2007 | Otake et al. | |
| 2007/0114600 A1 | 5/2007 | Hirler et al. | |
| 2008/0026590 A1* | 1/2008 | Zhuang | C23C 18/1208 438/758 |
| 2009/0309156 A1* | 12/2009 | Darwish | H01L 29/41766 257/332 |
| 2012/0043602 A1 | 2/2012 | Zeng et al. | |
| 2012/0241849 A1 | 9/2012 | Nozu | |
| 2014/0015039 A1 | 1/2014 | Hossain | |
| 2015/0076600 A1 | 3/2015 | Jun et al. | |
| 2016/0064478 A1 | 3/2016 | Sun et al. | |
| 2017/0309610 A1 | 10/2017 | Yao et al. | |
| 2018/0212027 A1 | 7/2018 | Cal et al. | |

* cited by examiner

METHOD FOR MANUFACTURING TRENCH MOSFET

RELATED APPLICATIONS

This application claims the benefit of Chinese Patent Application No. 201710942472.2, filed on Oct. 11, 2017, which is incorporated herein by reference in its entirety.

FIELD OF THE INVENTION

The present invention generally relates to the field of power electronics, and more particularly to methods for manufacturing trench MOSFETs.

BACKGROUND

In a shielded gate trench MOSFET, as compared to a typical MOSFET, the shield electrode may reduce the gate-drain capacitance and increase the cut-off voltage of the transistor. The gate electrode and the shield electrode may be insulated from each other by an inter-electrode dielectric (IED). The IED may have sufficient mass and thickness to support the potential difference between the shield electrode and the gate electrode. In addition, the interface well charge and dielectric well charge at the interface between the shield electrode and the IED layer and in the IED layer are primarily related to formation of the IED layer.

DETAILED DESCRIPTION

Figure 1:
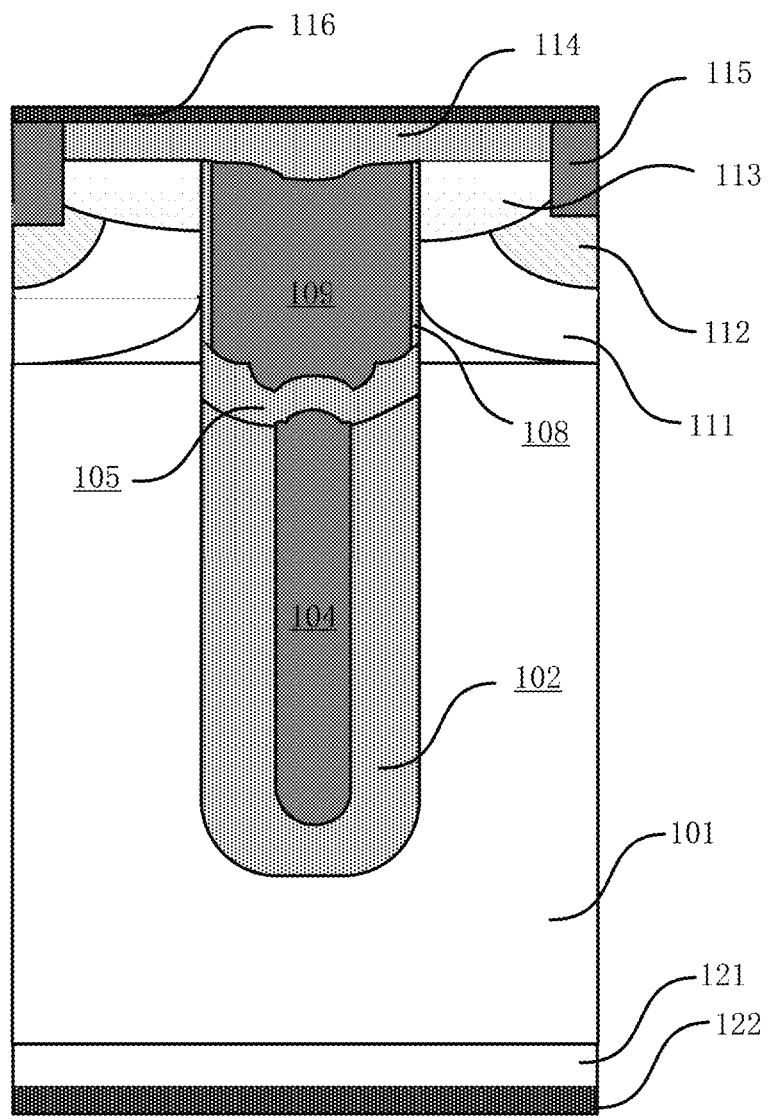
FIG. 1 is cross-sectional view of an example trench MOSFET, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A high quality inter-electrode dielectric (IED) having sufficient strength and sufficient reliability may provide the required electrical characteristics for a shielded gate trench metal-oxide-semiconductor field-effect transistor (MOSFET). Deposition of a high density plasma oxide film or the like may generally be used to form the IED layer between the gate electrode and the shield electrode. However, depositing a plasma oxide film can be a relatively difficult and costly operation. In particular embodiments, a method of forming shielded gate trench MOSFETs can meet the demand for high quality IEDs, and substantially ensure the performance of shielded gate trench MOSFETs while reducing associated production costs.

Unless the context clearly indicates otherwise, each part of the semiconductor device can be made of material(s) well known to those skilled in the art. For example, the semiconductor material may include at least one of a group III-V semiconductor, such as GaAs, InP, GaN, and SiC, and group IV semiconductor, such as Si, and Ge. A gate conductor may be made of any conductive material, such as metal, doped polysilicon, and a stack of metal and doped polysilicon, among others. For example, the gate conductor may be made of one selected from a group including TaC, TiN, TaSiN, HfSiN, TiSiN, TiCN, TaAlC, TiAlN, TaN, PtSix, $Ni_3Si$, Pt, Ru, W, and their combinations. A gate dielectric may be made of SiO2, or any suitable material having dielectric constant greater than that of SiO2. For example, the gate dielectric may be made of one selected from a group including oxides, nitrides, oxynitrides, silicates, aluminates, and titanates.

In one embodiment, a method of manufacturing a trench MOSFET can include: (i) forming an epitaxial semiconductor layer having a first doping type on a semiconductor substrate; (ii) forming a trench extending from a first surface of the epitaxial semiconductor layer to an internal portion of the epitaxial semiconductor layer; (iii) forming a first insulating layer and a shield conductor occupying a lower portion of said trench, where the first insulating layer is located on a lower sidewall surface and a bottom surface of the trench and separates the shield conductor from the epitaxial semiconductor layer; (iv) forming a second insulating layer covering a top surface of said shield conductor, where the second insulating layer is patterned by using a hard mask that at least partially fills an upper portion of the trench; (v) forming a gate dielectric layer and a gate conductor occupying an upper portion of the trench, where the gate dielectric layer is located on an upper sidewall surface of the trench and separates the gate conductor from the epitaxial semiconductor layer; and (vi) forming a body region, a source region, and a drain electrode.

Referring now to FIG. 1, shown is cross-sectional view of an example trench MOSFET, in accordance with embodiments of the present invention. For example, semiconductor substrate 121 can include silicon, and may be a first doped type. The "first" doping type is one of N type and P type, and a "second" doping type is the other one of the N type and P type. In order to form an N-type epitaxial semiconductor layer or region, an N-type dopant (e.g., P, As) can be doped in the epitaxial semiconductor layer or region. In order to form a P-type epitaxial semiconductor layer or region, a P-type dopant (e.g., B) can be doped in the epitaxial semiconductor layer and region. For example, semiconductor substrate 121 is an N-type doped.

Epitaxial semiconductor layer 101 of the first doping type may be on a surface of semiconductor substrate 121 opposite to that of drain electrode 122 (e.g., the first surface of semiconductor substrate 121). For example, epitaxial semiconductor layer 101 can include silicon. Epitaxial semiconductor layer 101 may be a lightly doped layer relative to semiconductor substrate 121. The second surface of semiconductor substrate 121 can be thinned by a thinning process, and drain electrode 122 may be formed on the second surface of semiconductor substrate 121.

A trench can extend from the first surface of epitaxial semiconductor layer 101 into its interior portion, and may end inside epitaxial semiconductor layer 101. Insulating layer 102 and shield conductor 104 can be formed in the trench, insulating layer 102 may be located on lower sidewall surface and a bottom surface of the trench, and insulating layer 102 can separate shield conductor 104 from epitaxial semiconductor layer 101. Insulating layer 105 may be formed on top portion of shield conductor 104 and insulating layer 102. Gate dielectric layer 108 and gate conductor 109 can be formed at an upper portion of the trench, gate dielectric layer 108 may be located on the upper surface of the trench, and gate dielectric layer 108 can separate gate conductor 109 from epitaxial semiconductor layer 101. Insulating layer 105 can separate shield conductor 104 and gate conductor 109, and also may separate insulating layer 102 from gate dielectric layer 108. For example, insulating layers 102 and 105 can include an oxide or a nitride (e.g., silicon oxide, silicon nitride, etc.), and shield conductor 104 and gate conductor 109 can include doped polysilicon.

Body region 111 of the second doping type may be formed in an upper region of epitaxial semiconductor layer 101 adjacent to the trench. Source region 113 of the first doping type can be formed in body region 111. Body contact region 112 of the second doping type may be formed in the body region 111. Here, the second doping type is opposite to the first doping type, where the first doping type is one of N type and P type, and the second doping type is the other one of the N type and P type. After source region 113 is formed, an interlayer dielectric layer 114 may be formed on source region 113 and gate conductor 109. Conductive channel 115 that penetrates interlayer dielectric layer 114 and source region 113 to reach body contact region 112 may be formed adjacent to source region 113. Source electrode 116 can be formed on interlayer dielectric layer 114, and source electrode 116 may be connected to body contact region 112 via conductive channel 115. For example, interlayer dielectric layer 114 can be an oxide layer having a specific thickness (e.g., silicon oxide).

Figure 2A:
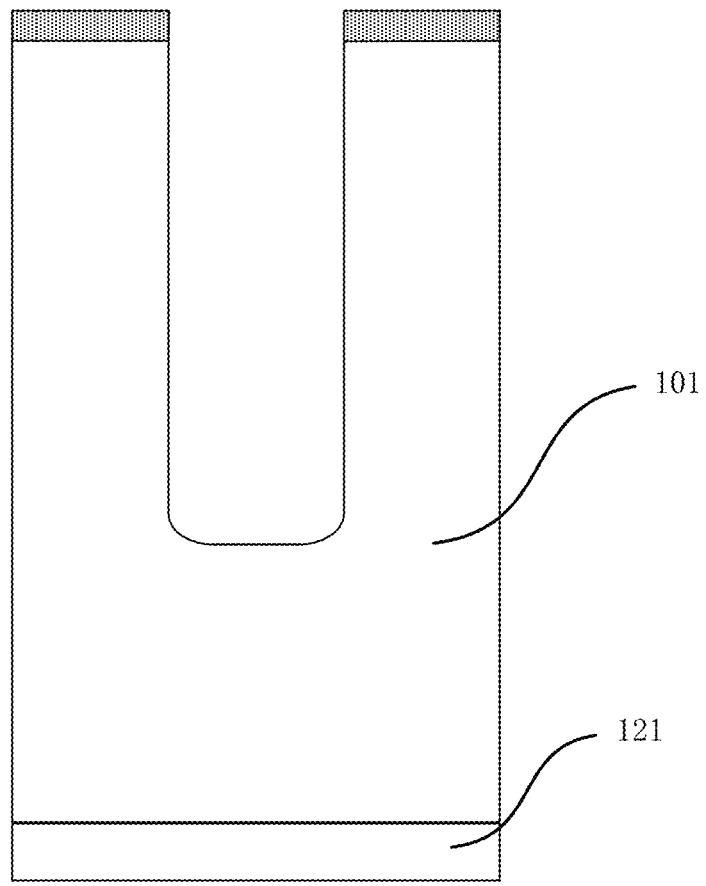
FIGS. 2A-2K are cross-sectional view of formation steps of an example method of manufacturing a trench MOSFET, in accordance with embodiments of the present invention.

Referring now to FIGS. 2A-2K, shown are cross-sectional view of formation steps of an example method of manufacturing a trench MOSFET, in accordance with embodiments of the present invention. In FIG. 2A, epitaxial semiconductor layer 101 can be formed on a semiconductor substrate 121. An oxide layer may be formed on epitaxial semiconductor layer 101, and a photoresist layer can be formed on the oxide layer. Then, an etching process may be performed, which can be dry etching (e.g., ion milling etching, plasma etching, reactive ion etching, laser ablation, etc.), or selective wet etching using an etching solution. A process of etching downward from the opening of the photoresist mask can be performed to form an opening of the oxide layer, whereby the oxide layer is patterned to be configured as a hard mask. The etching can be stopped on the first surface of epitaxial semiconductor layer 101 according to the selected etching process. After the hard mask is formed, the photoresist layer may be removed, such as by dissolution in a solvent or ashing process.

Epitaxial semiconductor layer 101 can be further etched by the above-described etching process using the hard mask to form a trench in epitaxial semiconductor layer 101. The trench may extend from the first surface of epitaxial semiconductor layer 101 into internal portion of epitaxial semiconductor layer 101. For example, the depth of the trench can be controlled by controlling the etching time. In FIG. 2A, the trench may end inside epitaxial semiconductor layer 101. After the trench is formed, the hard mask can be removed relative to the epitaxial semiconductor layer, such as by a selective etchant.

Figure 2B:
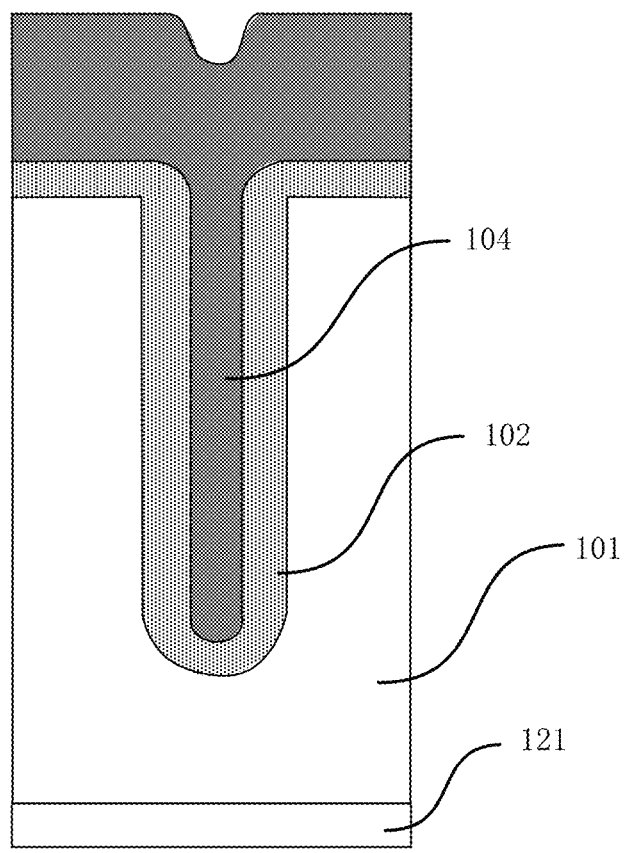

As shown in FIG. 2B, insulating layer 102 may be formed along the internal surface of the trench and the first surface of epitaxial semiconductor layer 101, such as by a thermal oxidation process. Shield conductor 104 can be formed to fill up the trench and to cover the first surface of epitaxial semiconductor layer 101, such as by a low pressure chemical vapor deposition process. Insulating layer 102 may separate shield conductor 104 from epitaxial semiconductor layer 101. Also, insulating layer 102 and shield conductor 104 may each extend to the first surface of epitaxial semiconductor layer 101. Insulating layer 102 can include of oxide or nitride (e.g., silicon oxide, silicon nitride, etc.), and shield conductor 104 can include doped polysilicon.

Figure 2C:
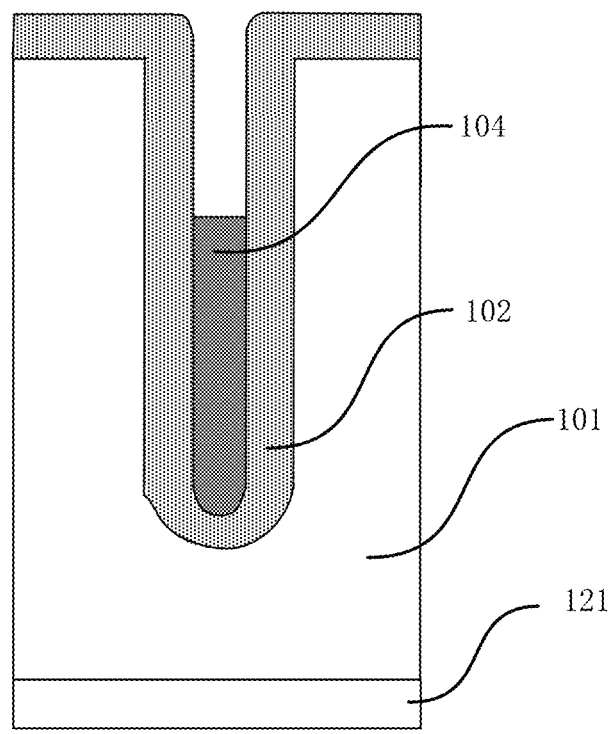

As shown in FIG. 2C, shield conductor 104 may be polished by a chemical mechanical polishing process (CMP). Shield conductor 104 can be selectively etched back relative to insulating layer 102 such that shield conductor 104 on the first surface of epitaxial semiconductor layer 101 and occupying an upper portion of the trench may be removed. For example, the etching back can be performed by a dry etching process.

Figure 2D:
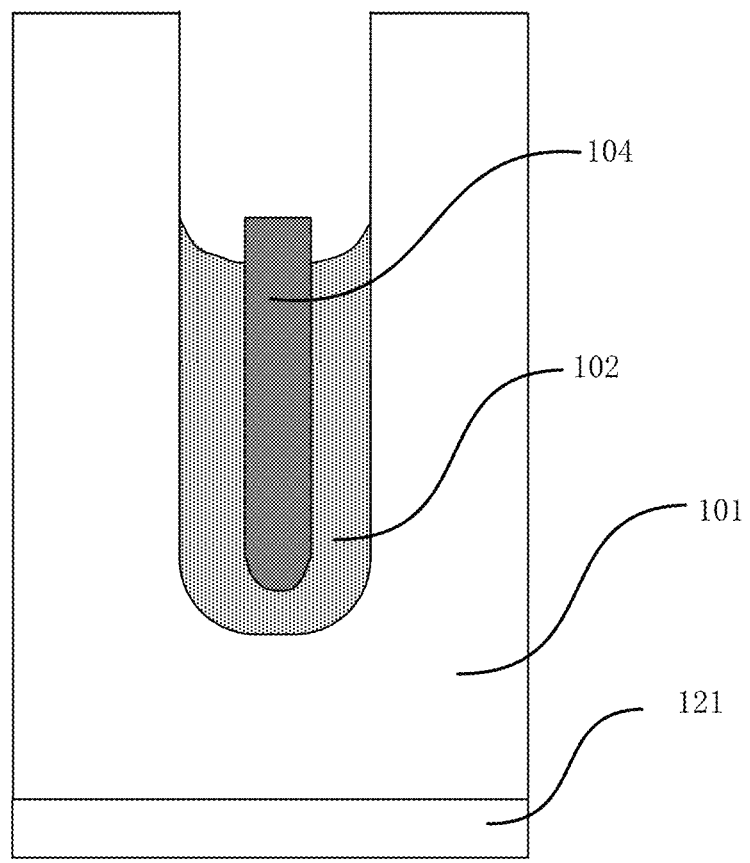

As shown in FIG. 2D, insulating layer 102 may be selectively etched relative to epitaxial semiconductor layer 101 by the above-described known etching process. Insulating layer 102 on the first surface of epitaxial semiconductor layer 101 and occupying the upper portion of the trench may be removed (e.g., by a wet etching process), such that insulating layer 102 is located between sidewalls of the trench and shield conductor 104, and insulating layer 102 does not cover the top of shield conductor 104. For example, the upper surface of insulating layer 102 may be lower than the upper surface of shield conductor 104.

Figure 2E:
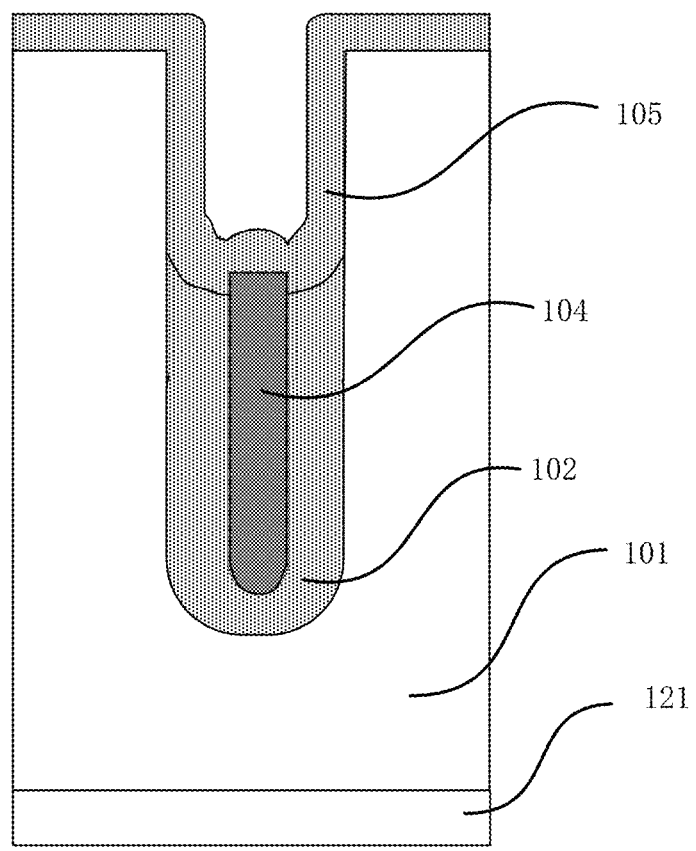

As shown in FIG. 2E, conformal insulating layer 105 can be formed on the top portion of shield conductor 104 and insulating layer 102, such as by a low pressure chemical vapor deposition process or a plasma enhanced chemical vapor deposition process. Insulating layer 105 can cover the top portion of shield conductor 104 and insulating layer 102, and may be located along sidewalls of the upper portion of the trench and the first surface of epitaxial semiconductor layer 101. Insulation layer 105 can include oxide or nitride (e.g., silicon oxide, silicon nitride, etc.).

Figure 2F:
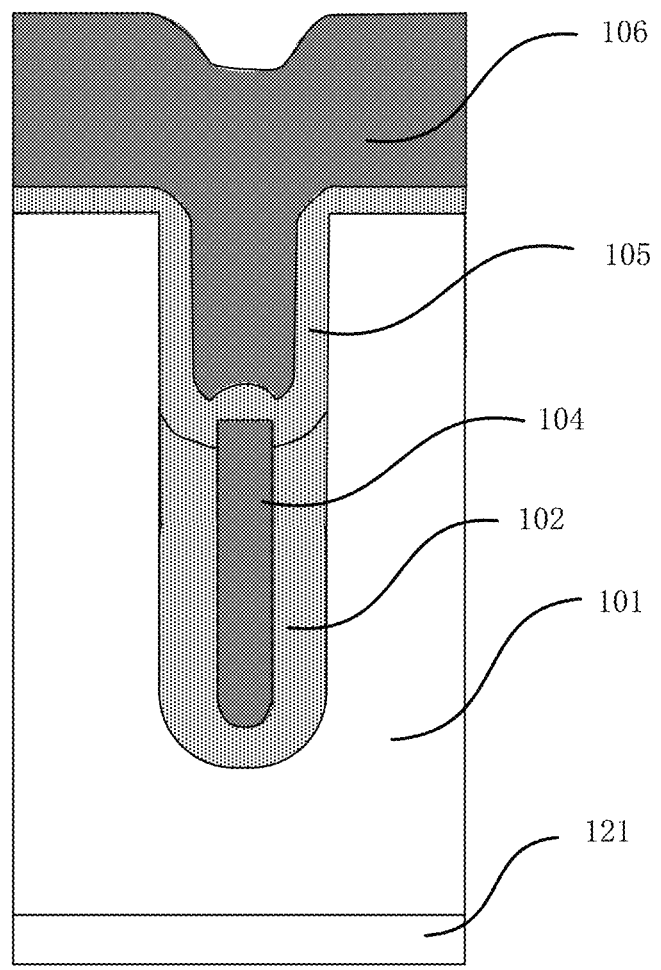

As shown in FIG. 2F, polysilicon may be filled up in the trench covered by insulating layer 105, such as by low pressure chemical vapor deposition process to form polysilicon layer 106. Polysilicon layer 106 can include a first portion filling up the trench, and a second portion covering the first surface of epitaxial semiconductor layer 101.

Figure 2G:
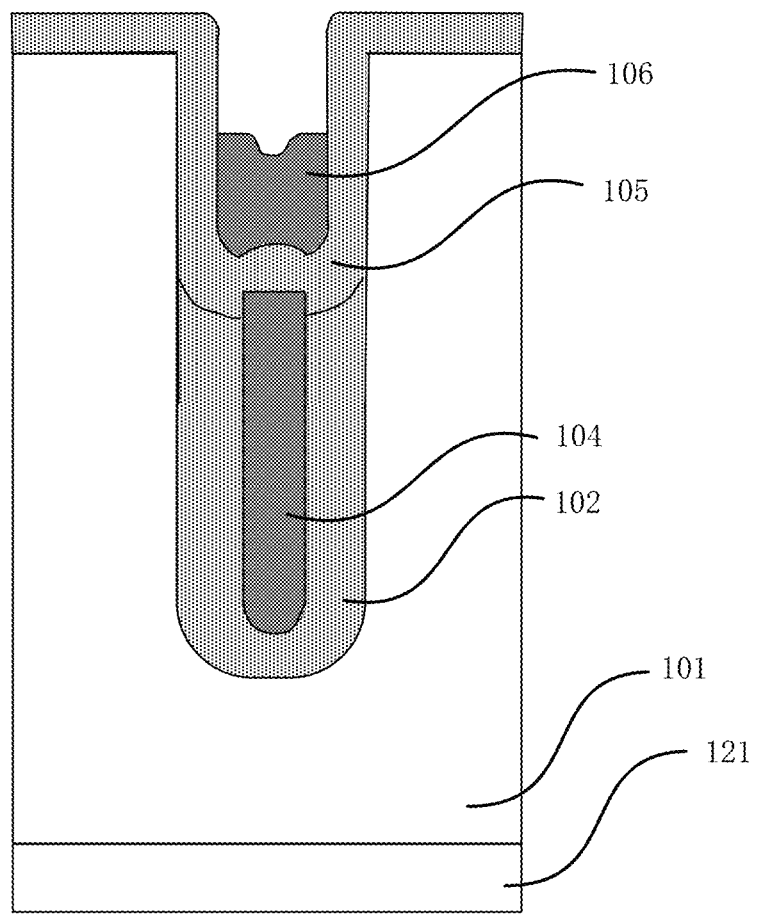

As shown in FIG. 2G, the second portion of polysilicon layer 106 may be removed by etching back or chemical mechanical planarization process such that the portion of insulating layer 105 on first surface of epitaxial semiconductor layer 101 is exposed. Further, at least a portion of polysilicon layer 106 occupying the upper portion of the trench may be removed by etching back; therefore, a portion of insulating layer 105 along sidewalls of the upper portion of the trench may be exposed. For example, the etching back can be performed by a dry etching process.

Dry etching is a technique of performing plasma etching of thin films. When a gas exists in the form of a plasma, it has two characteristics. On one hand, the chemical activity of these gases in the plasma is much stronger than in the normal state, so by choosing the appropriate gas according to the different materials to be etched, it can react with the material faster in order to achieve the purpose of etching removal. On the other hand, the electric field can be used to guide and may accelerate the plasma to have a certain energy, and when it bombards the surface of the object to be etched, the atoms of the material are shot out to achieve the purpose of etching using physical energy transfer. Therefore, dry etching is the result of a balance between physical and chemical processes on the wafer surface.

Figure 2H:
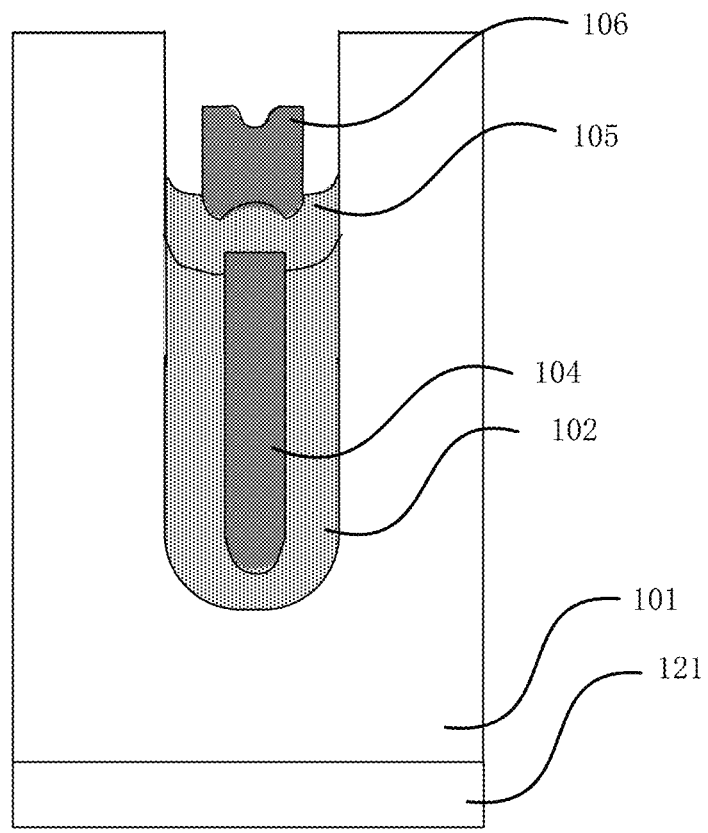

As shown in FIG. 2H, polysilicon layer 106 occupying the upper portion of the trench can be configured as a hard mask. The portion of insulating layer 105 on sidewalls of the upper portion of the trench and on the first surface of epitaxial semiconductor layer 101 can be removed by the above-described known etching process. As such, insulating layer 105 between shielded conductor 104 and polysilicon layer 106 may be retained. In this particular example, insulating layer 105 can be patterned by using polysilicon layer 106 as a hard mask. In another example, other suitable materials (e.g., other polycrystalline semiconductors, nitrides, etc.) can be used as a hard mask in order to pattern insulating layer 105.

Figure 2I:
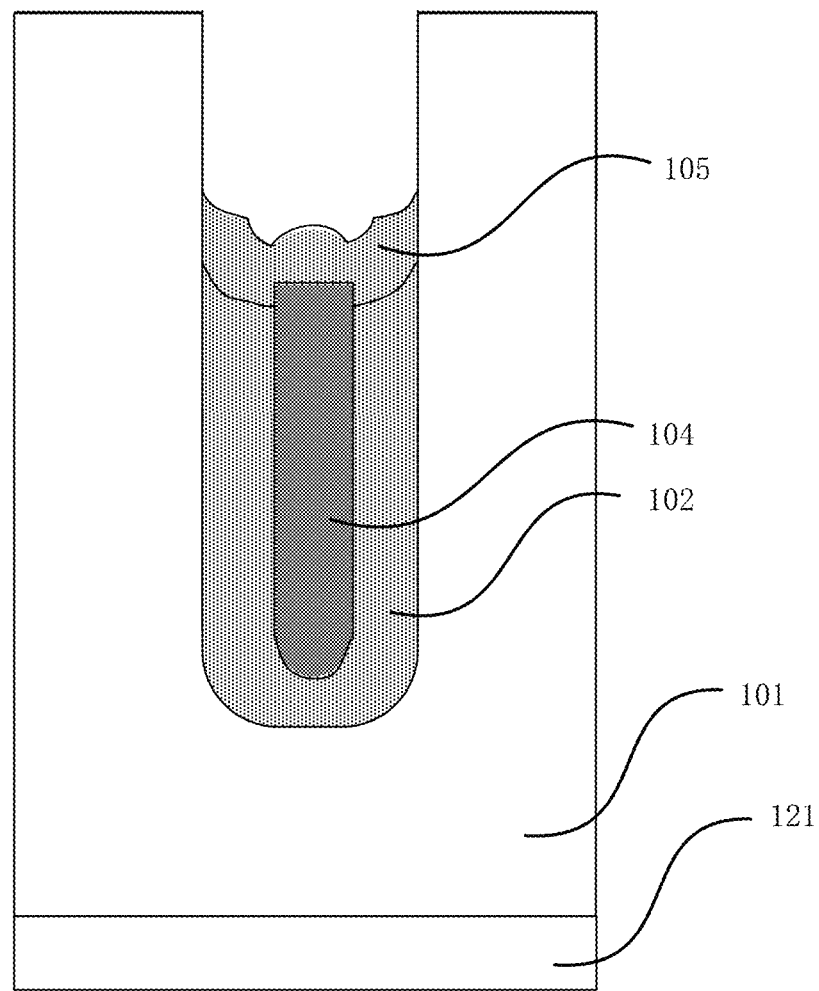

As shown in FIG. 2I, polysilicon layer 106 located inside the trench may be fully removed by etching back so that the upper surface of insulating layer 105 is exposed. For example, the etching back can be performed by dry etching.

Figure 2J:
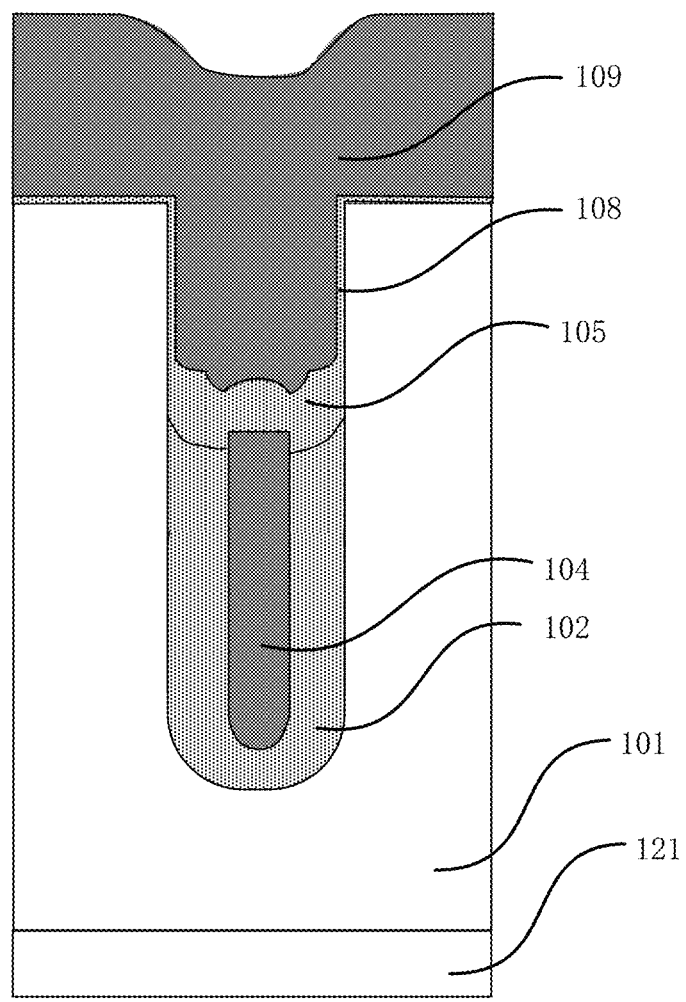

As shown in FIG. 2J, an oxide layer (e.g., gate dielectric layer 108) can be formed on sidewall surface of the upper portion of the trench and the first surface of epitaxial semiconductor layer 101, e.g., by a thermal oxidation process, such that sidewalls the trench are covered by gate dielectric layer 108. A thermal oxidation process is generally used to react silicon with gases containing oxides, such as water vapor and oxygen, at high temperatures, and to produce a dense layer of silicon dioxide (SiO2) film on the surface of silicon wafer. Further, polysilicon can fill up the trench covered with gate dielectric layer 108, such as by low pressure chemical vapor deposition, in order to form a gate conductor 109. Gate conductor 109 can include a first portion inside the trench and a second portion on the first surface of epitaxial semiconductor layer 101.

Figure 2K:
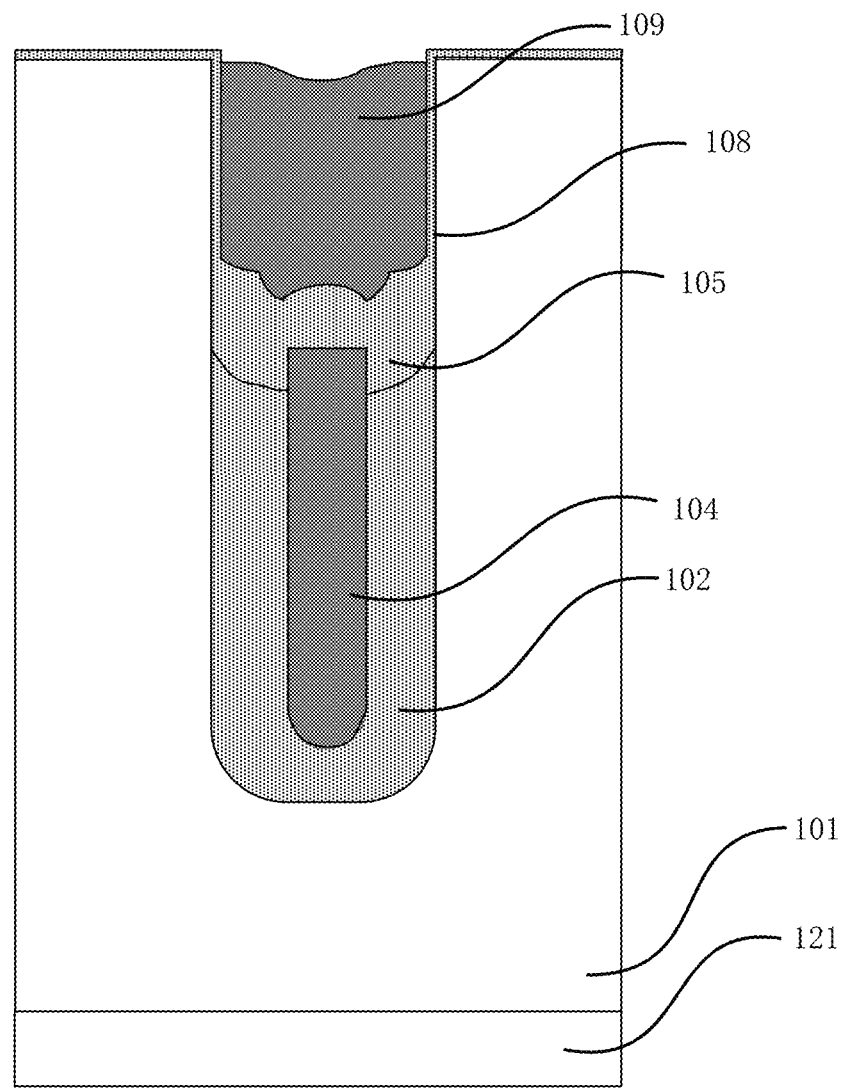

As shown in FIG. 2K, the second portion of gate conductor 109 on the first surface of epitaxial semiconductor layer 101 may be removed by etching back or chemical mechanical planarization process, such that gate conductor 109 is located inside the trench and the top surface of gate conductor 109 is not higher than the opening of the trench. Alternatively, the conductor layer of gate conductor 109 may be selectively removed relative to epitaxial semiconductor layer 101, and the conductor layer can be etched back such that the top surface of gate conductor 109 is not higher than the first surface of epitaxial semiconductor layer 101. The gate dielectric layer 108 covering the first surface of epitaxial semiconductor layer 101 may not need to be removed in order to serve as a barrier layer for subsequent implantation of the body region. The retained insulating layer 105 may insulate shield conductor 104 and gate conductor 109, and the retained insulating layer 105 may have a specific mass and thickness to support a potential difference that could exist between shield conductor 104 and gate conductor 109.

As shown in FIG. 1, a first ion implantation and driving technique may be performed to form body region 111 of a second doping type in the upper region of epitaxial semiconductor layer 101 adjacent to the trench. Further, a second ion implantation can be performed to form a source region 113 of the first doping type in body region 111. The second doping type may be opposite to the first doping type. The desired doping depth and doping concentration can be achieved by controlling the parameters of the ion implantation, such as the implantation energy and implantation dose. The lateral extension of body region 111 and source region 113 can be controlled using an additional photoresist mask. For example, body region 111 and source region 113 may be adjacent to the trench, and respectively separated into two portions by gate conductor 109 and gate dielectric 108.

In addition, interlayer dielectric layer 114 located on source region 113 can be formed, such as by the above-described deposition process, and chemical mechanical planarization may further be performed as necessary in order to obtain a flat surface. Interlayer dielectric layer 114 can cover the top surface of source region 113 and gate conductor 109. Body contact region 112 of the second doping type may be formed in body region 111, such as by the above-described etching process and an ion implantation process. Conductive channel 115 penetrating interlayer dielectric layer 114 and source region 113 reaching body contact region 112 may be formed, such as by the above-described etching process. Source electrode 116 can be formed on interlayer dielectric layer 114, and source electrode 116 may connect to body contact region 112 via conductive channel 115.

Drain electrode 122 can be formed on the second surface of semiconductor substrate 121 thinned by a thinning technique, such as by the above-described deposition process. In the above example, conductive channel 115, source electrode 116, gate conductor 109, shield conductor 104, and drain electrode 122, may be formed by a conductive material, such as a metal material (e.g., an aluminum alloy, copper, etc.).

In particular embodiments, manufacturing a trench MOSFET can include forming insulating layer 105 by patterning with a hard mask that at least partially fills the upper portion of the trench. Firstly, conformal insulating layer 105 may be formed by filling the upper portion of trench 105 such that insulating layer 105 covers a sidewall surface of the upper portion of the trench and the top of shield conductor 104. Secondly, polysilicon layer 106 can fill up the upper portion of the trench. Then, polysilicon layer 106 may be used as a hard mask to etch and remove a portion of insulating layer 105 on the upper sidewall surface of the trench. Finally, polysilicon layer 106 can be removed. The thickness of insulating layer 105 may have uniformity and stability to provide sufficient quality and thickness to support a potential difference that may exist between the shield conductor and the gate conductor.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a trench metal-oxide-semiconductor field-effect transistor (MOSFET), the method comprising:
   a) forming an epitaxial semiconductor layer having a first doping type on a semiconductor substrate;
   b) forming a trench extending from a first surface of said epitaxial semiconductor layer to an internal portion of said epitaxial semiconductor layer;
   c) forming a first insulating layer and a shield conductor occupying a lower portion of said trench, wherein said first insulating layer is located on a lower sidewall surface and a bottom surface of said trench and separates said shield conductor from said epitaxial semiconductor layer;

d) forming a second insulating layer covering a top surface of said shield conductor and conformally occupying an upper portion of said trench and covering an upper sidewall surface of said trench, wherein said forming said second insulating layer comprises filling up the upper portion of said trench with a hard mask layer, etching back a portion of said hard mask layer, etching and removing a portion of said second insulating layer on the upper sidewall surface of said trench using said hard mask layer, and removing said hard mask layer;

e) forming a gate dielectric layer and a gate conductor occupying the upper portion of said trench, wherein said gate dielectric layer is located on the upper sidewall surface of said trench and separates said gate conductor from said epitaxial semiconductor layer; and f) forming a body region, a source region, and a drain electrode.

2. The method of claim 1, wherein said first insulating layer comprises an oxide layer formed by a thermal oxidation or a low pressure chemical vapor deposition process.

3. The method of claim 1, wherein said second insulating layer comprises an oxide layer formed by a low pressure chemical vapor deposition or a plasma enhanced chemical vapor deposition process.

4. The method of claim 1, wherein said gate dielectric layer comprises an oxide layer formed by thermal oxidation process.

5. The method of claim 1, wherein said hard mask layer filling the upper portion of said trench comprises nitrides.

6. The method of claim 1, wherein said hard mask layer comprises a polysilicon layer.

7. The method of claim 6, wherein said filling up the upper portion of said trench with said polysilicon layer comprises:

a) depositing said polysilicon layer having a first portion in said trench and a second portion on said first surface of said epitaxial semiconductor layer; and b) removing said second portion of said polysilicon layer to expose a top portion of said second insulating layer.

8. The method of claim 7, further comprising removing at least a portion of said first portion of said polysilicon layer by an etching back process.

9. The method of claim 7, wherein said etching back process comprises a dry etching process.

10. The method of claim 6, wherein each of said shield conductor and said gate conductor comprises said polysilicon layer formed by a low pressure chemical vapor deposition process.

11. The method of claim 1, further comprising:

a) forming said body region having a second doping type in an upper region of said epitaxial semiconductor layer adjacent to the trench, wherein said second doping type is opposite to said first doping type;

b) forming said source region having said first doping type in said body region; and c) forming said drain electrode on a second surface of said semiconductor substrate, wherein said second surface and said first surface of said semiconductor substrate are opposite to each other.

12. The method of claim 11, wherein said first doping type is one of N type and P type, and said second doping type is the other one of N type and P type.

13. The method of claim 11, further comprising after the formation of said source region:

a) forming an interlayer dielectric layer on said source region and said gate conductor; and b) forming a source electrode on said interlayer dielectric layer.

14. The method of claim 13, further comprising:

a) forming a body contact region having said second doping type in said body region; and b) forming a conductive channel penetrating said interlayer dielectric layer and said source region to said body contact region, wherein said source electrode is connected to said body contact region via said conductive channel.

15. A trench metal-oxide-semiconductor field-effect transistor (MOSFET) formed by the method of claim 1, the MOSFET comprising:

a) a trench extending from a first surface of an epitaxial semiconductor layer to an internal portion of said epitaxial semiconductor layer;

b) a first insulating layer and a shield conductor that cover a lower portion of said trench;

c) a second insulating layer that covers a top surface of said shield conductor; and d) a gate dielectric layer and a gate conductor that cover the upper portion of said trench.

16. The MOSFET of claim 15, wherein a thickness of said second insulating layer is uniform.

17. The MOSFET of claim 15, wherein a quality of said second insulating layer is uniform.

* * * * *